US 6,296,709 B1
Oct. 2, 2001

(12) United States Patent
Krivokapic

(54) TEMPERATURE RAMP FOR VERTICAL DIFFUSION FURNACE

(75) Inventor: Zoran Krivokapic, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/511,796

(22) Filed: Feb. 23, 2000

(51) Int. Cl.$^7$ .................................................. C23C 16/00
(52) U.S. Cl. .................. 118/697; 118/696; 118/704; 118/715; 118/724; 118/725; 438/542; 438/935; 427/248.1
(58) Field of Search ..................... 118/715, 724, 118/725, 698, 697, 704; 438/542, 935; 427/248.1

(56) References Cited

U.S. PATENT DOCUMENTS

| 4,640,223 | * | 2/1987 | Dozier | 118/725 |
| 4,964,378 | | 10/1990 | Tamba | 123/41.57 |
| 5,001,327 | | 3/1991 | Hirasawa et al. | 219/390 |
| 5,029,554 | * | 7/1991 | Miyashita | 118/715 |
| 6,139,642 | * | 10/2000 | Shimahara | 118/724 |

FOREIGN PATENT DOCUMENTS

| 62-136810 | * | 6/1987 | (JP) | 118/724 |
| 62-290126 | * | 12/1987 | (JP) | 118/724 |

OTHER PUBLICATIONS

Shigeki Hirasawa et al., "Temperature Distribution in Semiconductor Wafers Heated in a Vertical Diffusion Furnace", IEEE Transactions on Semiconductor Manufacturing, vol. 6, No. 3, Aug. 1993, pp. 226–231.

Z. Krivokapic et al., "Temperature Nonuniformities on Silicon Wafers During Processing in Vertical Furnaces", presented at 6$^{th}$ FIDAP Conference, Chicago, May 21, 1995.

* cited by examiner

Primary Examiner—Richard Bueker
(74) Attorney, Agent, or Firm—Skjerven Morrill MacPherson LLP; Edward C. Kwok, Esq.

(57) ABSTRACT

An improved vertical diffusion furnace for semiconductor manufacturing processes is provided. Temperature and flow rate management enables more uniform temperature distribution across the wafer during ramp up and ramp down, thereby preventing wafer warp.

4 Claims, 4 Drawing Sheets

TEMPERATURE RAMP FOR VERTICAL DIFFUSION FURNACE

BACKGROUND OF THE INVENTION

1. Field of the Invention

The present invention relates generally to high temperature processing in semiconductor manufacturing. More specifically, the invention is directed to an improved vertical diffusion furnace and method of processing.

2. Description of the Related Art

High temperature processing is used for a variety of steps in semiconductor manufacturing. After ion implantation of highly energetic ions, a high temperature annealing cycle is required to recrystalize the resulting amorphous silicon layer. Further, the same dopants are driven to proper depths within the silicon by high temperature diffusion cycles. In addition, silicon dioxide, which serves both as a dielectric for MOS devices and as an electrical isolation layer, is usually grown in an oxidation step enhanced by high temperature.

There are varying approaches to high temperature processing. Rapid thermal processing (RTP) involves placing a wafer into a chamber and providing heat via an array of lamps. Another alternative is the use of a small-batch fast-ramp furnace in which large wafer spacings allow fast temperature ramping. U.S. Pat. No. 5,001,327 to Hirasawa et al., for example, describes a furnace in which two wafers are simultaneously heat-treated and then cooled in a cooling zone at a lower portion of the reaction tube to achieve uniform heat-treatment and cooling in a short time period. High temperature processing of merely two wafers at a time, however, results in poor productivity.

The third and most cost effective approach to high temperature processing is a large-batch vertical furnace. FIG. 1 illustrates a conventional large batch vertical diffusion furnace 10. A processing tube 12 has tube wall 14 which is surrounded by heating elements 16. A process gas flows in the direction 28 through a pre-heating tube 18 where it is heated to approximately the same temperature as tube wall 14. The process gas enters gas inlet 22 at an intake port 20 and then flows into processing tube 12 through showerhead 24. The process gas may flow out from processing tube 12 through gas outlet 26.

A batch of more than 150 wafers may be loaded into processing tube 12. FIG. 2 illustrates wafers 30 loaded in silicon carbide (SiC) boats 34 which are supported by SiC boat rods 32.

FIG. 3 illustrates a typical temperature distribution during a temperature stabilization cycle at 1373 K. Prior to the stabilization cycle at 1373 K, the tube walls and the pre-heating tube through which the process gas passed prior to entering the processing tube were ramped up from 1273 K to 1323 K at the rate of 8 K/minute and from 1323 K to 1373 K at the rate of 4 K/minute. The radial temperature of the wafers was measured. The edges of the wafer, represented by the left and right portions of the curve, have a higher temperature than the center of the wafer, represented by the middle of the curve. There is also a temperature difference between the edges of the wafer. The edge of the wafer not inside the boat red such that it was fully exposed to process gas flow, represented by the left side of the curve, has a temperature less than the temperature across the wafer where the edge is inside the boat rod and thus not fully exposed to process gas flow, represented by the right side of the curve. The temperature difference between the wafer edges, therefore, depends on whether the edge is open or inside the boat rods, and that temperature difference is significant at more than 5 degrees. In any case, both edges are at higher temperatures than is the center of the wafer.

Radial temperature nonuniformity, as illustrated in FIG. 3 and discussed above, causes thermoplastic deformation. The temperature difference results in stresses that can be sufficient to generate dislocations and form slip bands. The slip damage typically occurs at temperatures above 900° C. and also depends on the amount of oxygen precipitation inside the wafer. These defects can lead to yield loss due to leaky p-n junctions, reduced carrier mobility, and warp-induced focusing problems. The demand for faster wafer throughputs has necessitated faster ramping cycles. However, fast ramping cycles tend to cause temperature gradients. Defects in wafers are mainly generated by local temperature gradients. During temperature ramp up & ramp down, a temperature gradient in a wafer causes slip defects and dislocations in silicon.

FIG. 4 illustrates the temperature difference during the ramping cycle employed in FIG. 3. Full diamonds represent the wafer edge inside the boat rod, while open circles represent the wafer edge away from the boat rod. Triangles represent the critical temperature for the occurrence of slip plane defects. It is evident from FIG. 4 that the temperature stress in the wafer vastly exceeds the empirical limit for slip planes formation.

FIG. 5 illustrates a ramping cycle with three five-minute holding periods. Note that the twenty-minute stabilization cycle at 1373 K does not provide sufficient time for wafers to reach thermal equilibrium, as the temperature at the center of the wafer, Tc, differs from that of the edges of the wafer, Te.

FIG. 6 shows maximum gradients across the wafer for the ramping cycle of FIG. 5. Since local gradients cannot be experimentally measured during processing, the radial temperature difference is used as a measure for slip occurrence. FIG. 7 shows the temperature difference for the ramping cycle of FIG. 5. Open circles represent the critical temperature for slip formation. Note that the slip limit is exceeded throughout the ramp up to 1373 K, while the slip limit is exceeded during ramp down from 1373 K only twice.

As defects in a wafer are mainly generated by local temperature gradients, it is desirable to have a vertical diffusion furnace which allows even heating and cooling across the wafer.

SUMMARY

The present invention provides a vertical diffusion furnace for semiconductor manufacturing processes. The furnace comprises a vertical processing tube, having a wall capable of being heated, wherein a plurality of semiconductor wafers are arranged at regular intervals; a first gas conduit connectable to the processing tube for supplying a process gas at a first temperature to the processing tube during ramp up; and a second gas conduit connectable to the processing tube, which is capable of heating a process gas to a second temperature, for supplying the preheated process gas at the second temperature to the processing tube during ramp down.

In one embodiment, the first and second gas conduits are capable of introducing the processing gas into the processing tube at flow rates sufficient to create turbulent flow.

The present invention also provides a method for the heat treatment of semiconductor wafers in a vertical diffusion furnace. A processing tube is heated to a predetermined temperature. A processing gas is introduced into the processing tube through a first gas conduit during ramp up such that the processing gas enters the processing tube at approximately room temperature. A processing gas in a second gas conduit is preheated to a temperature approximately equal to the predetermined temperature of the processing tube and introduced into the processing tube through the second gas conduit during ramp down.

In another embodiment of the method, the processing gas is introduced into the processing tube at flow rates sufficient to create turbulent flow.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
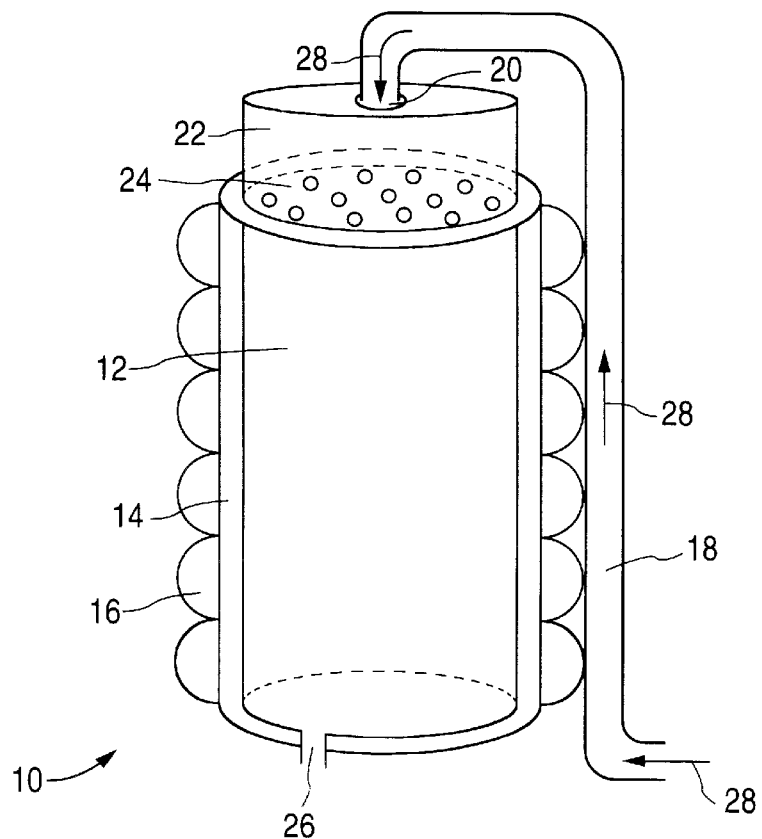
FIG. 1 is a conventional vertical diffusion furnace.
Figure 2:
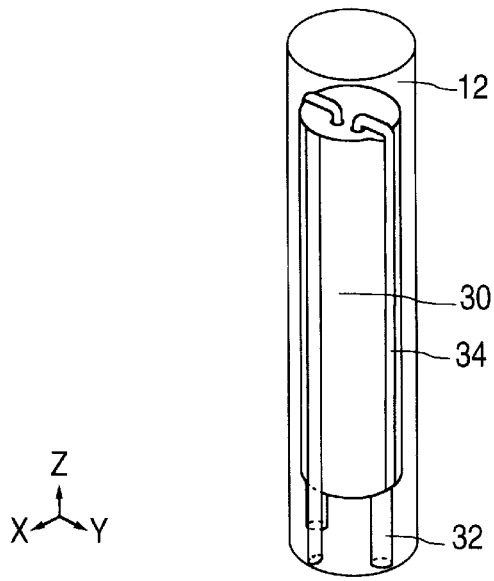
FIG. 2 is a three-dimensional mesh created by ICEM-CFD, showing the wafer stack and boat rods.
Figure 3:
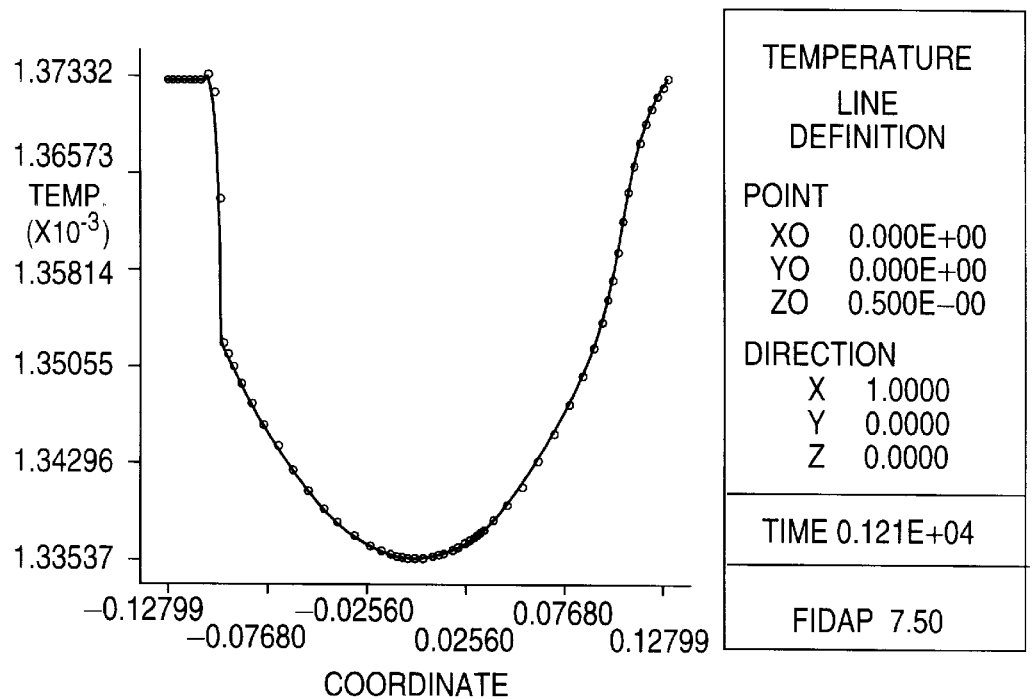
FIG. 3 is a graph illustrating the radial distribution of temperature across a single wafer.
Figure 4:
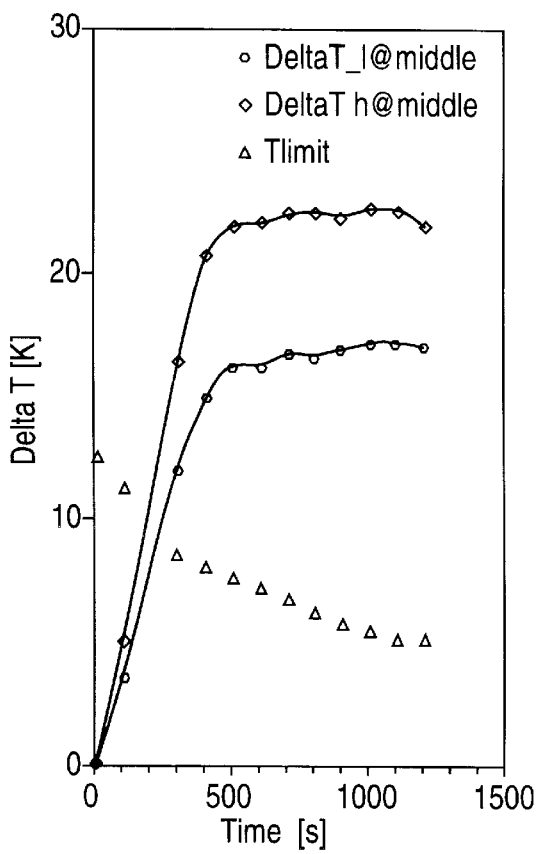
FIG. 4 is a graph illustrating the temperature difference during the ramping cycle from 1273–1373 K.
Figure 5:
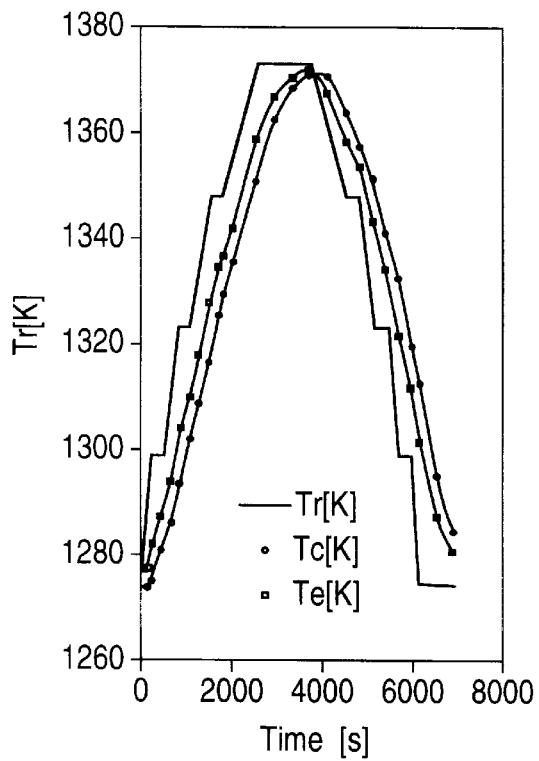
FIG. 5 is a graph illustrating the ramping cycle from 1273–1373 K with three five-minute holdings.
Figure 6:
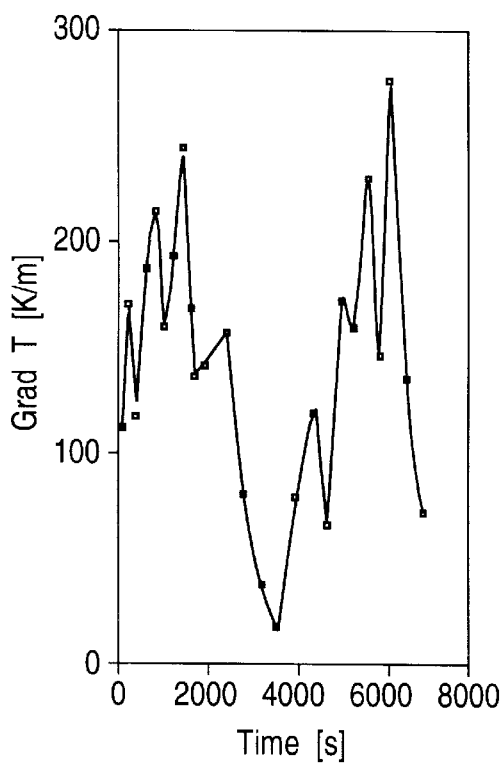
FIG. 6 is a graph illustrating the maximum gradients across a wafer for the ramping cycle from FIG. 5.
Figure 7:
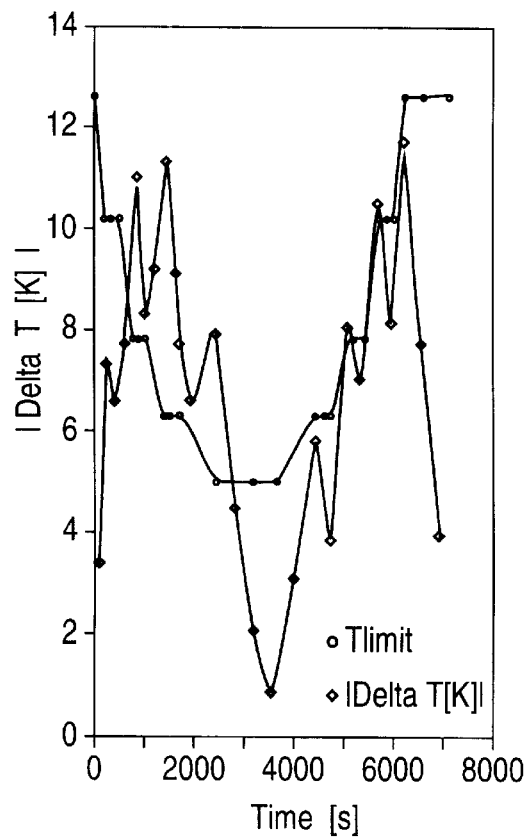
FIG. 7 is a graph illustrating the temperature difference for the ramping cycle from FIG. 5.
Figure 8A:
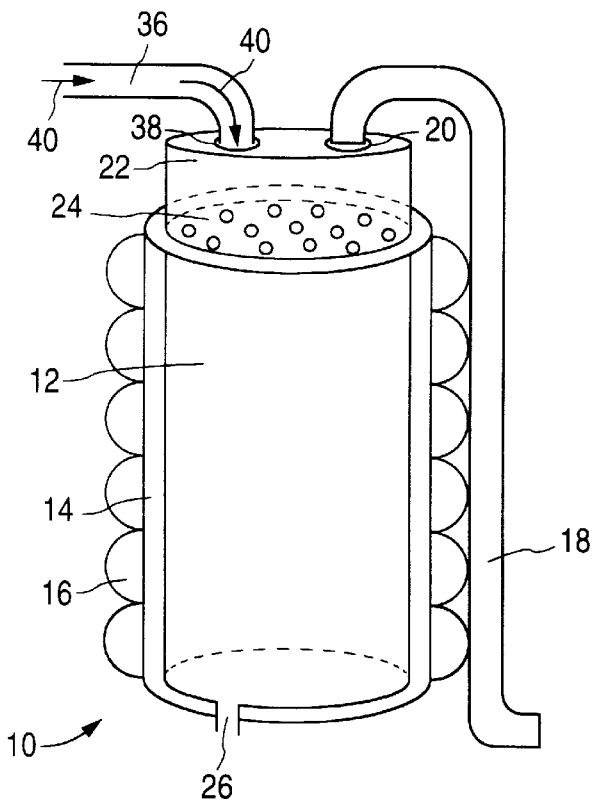
FIGS. 8A–8B illustrate an improved vertical diffusion furnace in accordance with embodiments of the present invention.
Figure 8B:
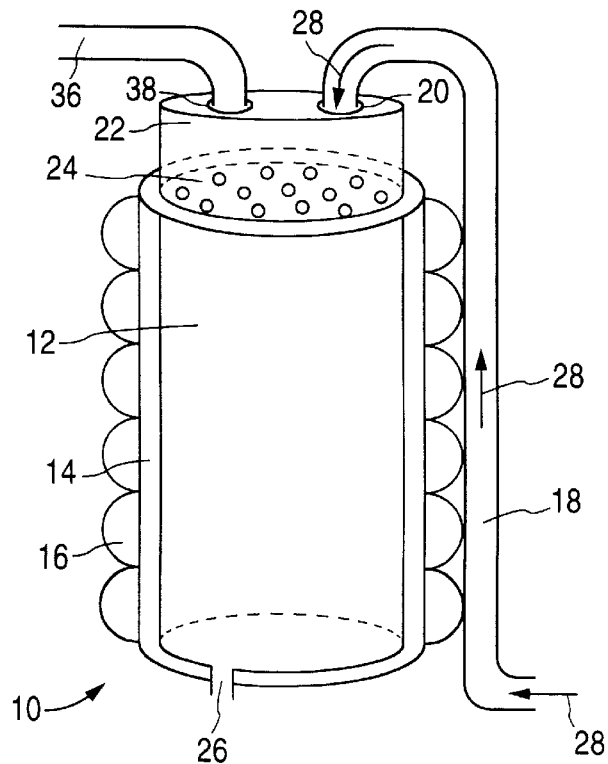

The vertical diffusion furnace of the present invention differs in structure from the conventional vertical diffusion furnace of FIG. 1 in that gas inlet 22 has dual intakes for dual process gas conduits in accordance with the present invention. Referring to FIGS. 8A and 8B, a first process gas conduit 36, which delivers unheated process gas, is connectable to gas inlet 22 through a first intake 38. A second process gas conduit 18, which both pre-heats and delivers process gas as in the conventional vertical diffusion furnace, is connectable to gas inlet 22 through a second intake 20.

During ramp up, as shown in FIG. 8A, process gas at approximately room temperature flows in the direction 40 through first process gas conduit 36, enters inlet 22 via first intake 38, and enters processing tube 12 in a uniform manner through showerhead 24. Because the process gas is not pre-heated and thus enters processing tube 12 at a temperature much lower than that of the tube walls, accelerated heating of the wafer edge is prevented.

During ramp down, as shown in FIG. 8B, process gas, having passed in the direction 28 through the pre-heated second process gas conduit 18 adjacent to heating elements 16, enters inlet 22 via second intake 20 and then enters processing tube 12 in a uniform manner through showerhead 24 at approximately the same temperature as tube wall 14. Because process gas enters processing tube 12 at the temperature of the diffusion or other processing step, accelerated cooling-off of the wafer edge is prevented.

In one embodiment, the flow rate of the process gas through the first and second process gas conduits 18 and 36 is increased to create turbulent flow. While the typical flow rate for use with 8-inch wafers in a conventional vertical diffusion furnace as shown in FIG. 1 is approximately 14 L/minute, turbulent flow may be achieved for use with the present invention by increasing the typical flow rate 3–4 times. Care must be exercised as the flow rate is increased such that the flow rate is not so high that excess shaking of wafers results in damage to the wafer surface or even wafer breakage. The turbulent flow promotes increased gas flow between wafers 30 and thus more uniform temperature distribution across the wafer, thereby further enhancing the temperature equalizing effect of non-isothermal gas flow.

Although the invention has been described with reference to particular embodiments, the scope of the present invention is not limited thereby. Various adaptations and combinations, the features of the embodiments disclosed are within the scope of the invention as defined by the following claims.

What is claimed is:

1. A vertical diffusion furnace for semiconductor manufacturing processes comprising:

a vertical processing tube for housing a plurality of semiconductor wafers; said processing tube having a tube wall capable of being heated to a predetermined temperature;

a first gas conduit, connected to said processing tube and a source of process gas, said source being capable of supplying the process gas to said processing tube;

a second gas conduit, connected to said processing tube and a source of preheated process gas, said source being capable of supplying the preheated process gas to said processing tube; and control unit for said first and said gas conduits, said control unit configured so as to cause said process gas to be supplied to said process tube through said first conduit at approximately room temperature during ramp-up and said preheated process gas to be supplied to said processing tube through said second gas conduit at said predetermined temperature of said tube during ramp down.

2. The vertical diffusion furnace of claim 1 wherein said first gas conduit and said second gas conduit are capable of introducing said processing gas at flow rates sufficient to create turbulent flow.

3. A method for heat treatment of semiconductor wafers in a vertical diffusion furnace comprising:

heating a processing tube to a predetermined temperature;

introducing a processing gas at approximately room temperature into said processing tube through a fist gas conduit during ramp up;

preheating a processing gas in a second gas conduit to approximately said predetermined temperature; and introducing said preheated processing gas into said processing tube through said second gas conduit during ramp down.

4. The method of claim 3 wherein processing gas is introduced into said processing tube at flow rates sufficient to create turbulent few.

* * * * *

UNITED STATES PATENT AND TRADEMARK OFFICE
CERTIFICATE OF CORRECTION

PATENT NO.    : 6,296,709 B1
DATED         : October 2, 2001
INVENTOR(S)   : Zoran Krivokapic It is certified that error appears in the above-identified patent and that said Letters Patent is hereby corrected as shown below:

Column 1,
Line 62, delete "red" and insert -- rod --;

Column 4,
Line 21, delete the comma (,) after "combinations";
Line 21, delete the word "the" in the first instance and insert -- of --; and
Line 45, after "tube" insert -- wall --.

Signed and Sealed this

Twenty-eighth Day of January, 2003

JAMES E. ROGAN
*Director of the United States Patent and Trademark Office*